United States Patent [19]

Batta et al.

[11] Patent Number: 5,262,923
[45] Date of Patent: Nov. 16, 1993

[54] RAILING WITH GROUNDING TABS FOR GROUNDING AND MOUNTING COMPUTER COMPONENTS IN A COMPUTER

[75] Inventors: Krishan K. Batta, Canoga Park; Gene Bejer; Ghodratollah Shakibai, both of Moorpark, all of Calif.

[73] Assignee: Tandon Corporation, Moorpark, Calif.

[21] Appl. No.: 718,604

[22] Filed: Jun. 21, 1991

[51] Int. Cl.$^5$ .................. H05K 5/02; H05K 7/10; A47B 88/06
[52] U.S. Cl. ............................. 361/685; 439/354; 439/377; 312/333; 312/334.7; 312/334.44; 384/21; 361/818; 361/730
[58] Field of Search .......... 312/332, 333, 334.7, 312/334.44; 384/20, 21, 22; 439/64, 92, 94, 354, 377; 174/35 R, 35 GC; 361/390, 391, 424, 392-394

[56] References Cited

U.S. PATENT DOCUMENTS

| | | |
|---|---|---|
| 599,222 | 2/1898 | Chappell ................ 292/19 |
| 1,600,497 | 9/1926 | Wheeler ................ 292/88 |
| 1,765,443 | 6/1930 | Peterson . |
| 1,832,729 | 11/1931 | Ohnstrand ................ 312/332 |
| 2,065,651 | 12/1936 | Burton . |
| 2,629,764 | 2/1953 | Wiley ................ 174/35 GC |
| 3,277,230 | 10/1966 | Stickney et al. . |
| 3,313,564 | 4/1967 | Pultz ................ 292/87 |
| 3,381,992 | 5/1968 | Friesen ................ 292/87 |
| 3,631,299 | 12/1971 | Meyer et al. . |
| 3,668,476 | 6/1972 | Wrabel et al. . |
| 4,068,872 | 1/1978 | Smith ................ 292/87 |
| 4,215,796 | 8/1980 | Johnston et al. ................ 220/306 |
| 4,226,491 | 10/1980 | Kazama et al. . |
| 4,310,870 | 1/1982 | Kia et al. ................ 361/415 |
| 4,323,979 | 4/1982 | Johnston ................ 364/708 |
| 4,384,165 | 5/1983 | Loving, Jr. et al. ................ 174/35 GC |
| 4,392,697 | 7/1983 | Kousens . |
| 4,453,790 | 6/1984 | Cohen et al. . |
| 4,543,447 | 9/1985 | Brewer ................ 174/35 GC |
| 4,697,044 | 9/1987 | Ishikawa ................ 174/35 R |
| 4,713,633 | 12/1987 | Saito et al. ................ 333/222 |
| 4,760,214 | 7/1988 | Bienia et al. ................ 174/35 GC |
| 4,780,570 | 10/1988 | Chuck ................ 174/35 GC |
| 4,821,145 | 4/1989 | Corfits et al. ................ 361/383 |
| 4,840,286 | 6/1989 | Heberling et al. ................ 220/306 |
| 4,870,605 | 9/1989 | Vo ................ 364/708 |
| 4,922,125 | 5/1990 | Casanova et al. ................ 307/149 |
| 4,960,384 | 10/1990 | Singer et al. ................ 361/391 X |
| 4,979,909 | 12/1990 | Andrews ................ 312/333 X |
| 5,014,160 | 5/1991 | McCoy, Jr. ................ 361/424 |
| 5,020,926 | 6/1991 | Wilhelm ................ 361/391 X |
| 5,032,689 | 7/1991 | Halligan et al. ................ 174/35 R |
| 5,045,960 | 9/1991 | Eding et al. ................ 360/97.01 |
| 5,067,041 | 11/1991 | Cooke et al. ................ 361/394 |
| 5,123,721 | 6/1992 | Seo ................ 312/333 |

FOREIGN PATENT DOCUMENTS

| | | |
|---|---|---|
| 2952370 | 7/1981 | Fed. Rep. of Germany . |
| 3200646 | 8/1982 | Fed. Rep. of Germany . |
| 3304178 | 8/1983 | Fed. Rep. of Germany . |
| 3630397 | 3/1988 | Fed. Rep. of Germany . |

OTHER PUBLICATIONS

Tinnerman Catalog #7000F, Eaton Corporation, p. 39, copyright 1987.

*Primary Examiner*—Leo P. Picard
*Assistant Examiner*—Michael W. Phillips

[57] ABSTRACT

A device adapted for attachment to the side of a disc drive for mounting the disc drive into a computer consists of a rectangular body having a connector member on one end. The connector member is bent to enable it to resiliently move relative to the body. Grounding tabs disposed on the body are bent up from the body to enable them to resiliently move relative thereto, and their tips are bent down to facilitate smooth installation and removal of the disc drive. A protruding latch member and stopping flap are disposed on the connector end. A secondary stop is disposed on the end of the body opposite the connector member.

17 Claims, 4 Drawing Sheets

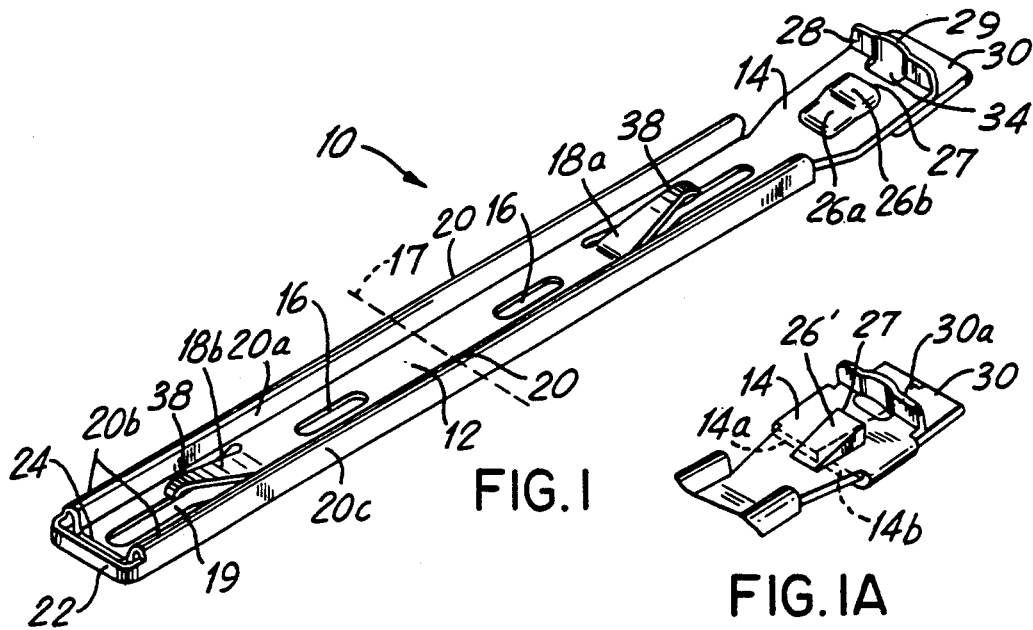
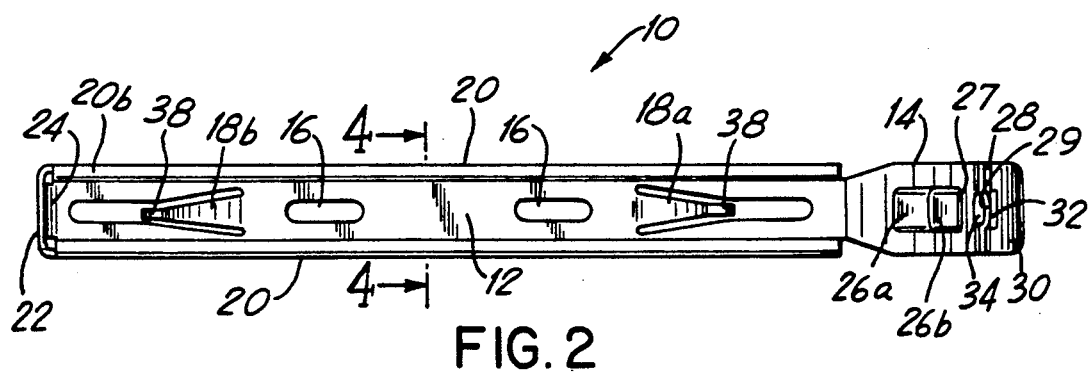
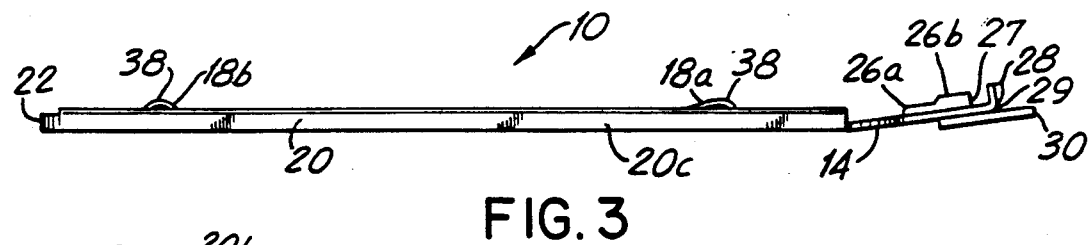
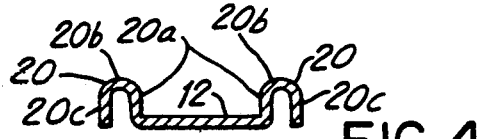
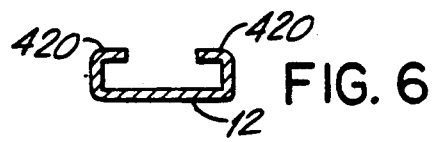
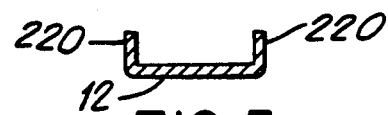
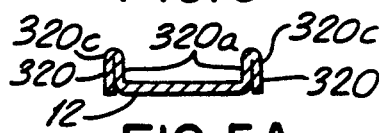

RAILING WITH GROUNDING TABS FOR GROUNDING AND MOUNTING COMPUTER COMPONENTS IN A COMPUTER

FIELD OF THE INVENTION

The present invention relates to the field of mounting devices, and particularly to devices for mounting computer components such as disc drives and other removable memory media.

BACKGROUND OF THE INVENTION

A number of different methods and devices are used to mount disc drives and other components in computers. One method which was widely used in the past was to simply screw the disc drive directly to the chassis of the computer, which made installation and removal time-consuming and cumbersome. As computers have proliferated and improved, devices have been developed which facilitate installation and removal of disc drives. One such device comprises two flat rectangular side pieces which are attached to opposing sides of the disc drive. Receiving rails are provided in the area of the computer chassis where the disc drive is to be mounted (the "bay"), and are adapted to cooperate with the side pieces in sliding engagement. The disc drive is inserted into the bay, with the side pieces cooperating with the receiving rails. When the disc drive is fully into the bay, it is secured against movement by screwing the side rails to the chassis by conventional screws, or by tightening a screw to press against a side piece or the disc drive itself.

On some occasions, such as repair or upgrading of the computer, the disc drive must be removed from the bay. Upon reinstallation the screws, because of the inconvenience of replacing them, are sometimes not replaced; rather, the front facade of the computer (the "fascia") is relied upon to prevent the disc drive from sliding out of the machine.

In some machines which use the rectangular side pieces, the pieces are mounted such that their front ends are recessed slightly from the front of the bay when the disc drive is installed. Tabs which have been bent at right angles are then employed to secure the disc drive in the machine. Each tab is inserted into the bay at the side of the disc drive such that the end of one face of the tab abuts the front of the side piece, while the other face lies against the chassis at the front of the bay. The latter face is then secured against the chassis by a screw. Some mounting devices have combined the side piece and bent tab into one piece.

Another prior art mounting device comprises two receiving rails disposed at the bottom of the bay which slidingly engage two corresponding plastic rails at the bottom of the disc drive. A center plastic rail, upon which is disposed a male latch member, protrudes from the bottom of the disc drive. When the disc drive is installed in the bay, the latch member enters a hole in the bay to secure the disc drive against forward movement. The disc drive is removed by grasping the protruding center rail, flexing it to free the latch member from the hole, and sliding the disc drive out.

Most prior art mounting devices do not prevent undesired rearward movement of the disc drive. A back wall is usually provided in the bay for this purpose.

Many prior art mounting devices are constructed of plastic to reduce weight and expense. The plastic is often metallicized by mixing into or painting onto the plastic a metallic solution in order to reduce electromagnetic field interference. The metallicized plastic, however, is not sufficient to ground the disc drive to the chassis. A grounding wire must therefore be included in the data or power supply plugs of the disc drive, or be directly wired from the disc drive to the chassis. Grounding wires are often required even with metal mounting devices, since movement of conventional devices relative to the chassis creates an unreliable connection.

OBJECTS AND SUMMARY OF THE INVENTION

It is therefore an object of the present invention to provide for the secure installation of a disc drive into a computer.

It is a further object of the invention to enable easy and convenient installation and removal of a computer disc drive.

It is a further object of the invention to provide for the proper grounding of a disc drive to the computer chassis without need for separate grounding wires.

In accordance with one aspect of the invention, a device for mounting a disc drive into a computer comprises a body portion adapted for attachment to the disc drive and a metal grounding tab attached at its base to the body portion protruding away from the body portion at an angle, the tip of the grounding tab being bent toward the body portion.

In accordance with another aspect of the invention, a device adapted to be attached to one side of a computer component for mounting the computer component into a bay comprises a substantially rectangular body portion and a U-shaped rail disposed on each lengthwise edge of the body portion, the rails being situated such that the open side of the U preferably faces the side of the computer component to which the device is attached. The rails are adapted to cooperate with receiving rails disposed in the bay for proper placement and convenient insertion and removal of the disc drive.

In accordance with another aspect of the invention, a mounting device comprises a body portion having a first end and a second end, the first end comprising a connecting member bent at an angle from the body so as to form a spring. A latching member is disposed on the connecting member, and a stop is disposed on the connecting member for prevention of undesired rearward movement of the mounting device. A grounding tab is disposed on the body portion, and a rail is disposed lengthwise on the body portion.

In accordance with another aspect of the invention, a device for mounting a disc drive into a computer bay comprises a body portion adapted for attachment to the disc drive, a connecting member disposed at an angle from the body portion on a first end of the body portion, and a latch protrusion disposed on the connecting member adapted for insertion into a recess provided in the computer bay for engagement of the member when the disc drive is fully inserted into the bay. A stop extends from the connecting member at substantially right angles to the latter, such that when the disc drive is fully inserted into the computer bay, the stop abuts the front of the bay preventing the disc drive from being inserted any farther into the bay. A release protrusion is attached to the connecting member and extends out of the bay when the disc drive is fully inserted into the bay, the release protrusion extending sufficiently for an operator to deflect the release protrusion, disengage the latch protrusion from the recess, and pull the disc drive out of the computer.

Specifically, and in a preferred embodiment, a device for mounting a computer disc drive into a computer comprises a substantially rectangular steel piece adapted to be attached to the side of the disc drive, the steel piece having a first end, a body, and a second end, the first end being bent relative to the body. Two rails are disposed on the body, each being formed on a lengthwise edge of the body by bending the lengthwise edge into a U-shaped configuration, thus forming an inner wall, a top, and an outer wall, the inner wall and the top terminating near the second end of the steel piece, the outer wall being bent around the second end to form an end wall, and the second end of the steel piece being bent up slightly to abut the end wall to minimize sharp edges. A grounding tab is disposed on the steel piece, being angularly disposed from the latter to act as a spring whose tip is bent downwardly for smooth insertion of the disc drive into the computer and for reliable grounding. A latch protrusion is disposed on the first end for selective latching engagement with a corresponding latch recess in the computer. A stop is disposed on the first end for selective abutting engagement with the front of the bay of the computer into which the disc drive is inserted.

BRIEF DESCRIPTION OF THE DRAWINGS

These and other objects, aspects, and embodiments of the present invention will be described with reference to the following drawing figures, of which:

FIG. 1 is a perspective view of an embodiment of a mounting device according to the present invention;

FIG. 1A is a partial perspective view of another embodiment of a mounting device according to the invention;

FIG. 2 is a top plan view of the mounting device of FIG. 1;

FIG. 3 is a side elevational view of the mounting device of FIG. 1;

FIG. 4 is a rear view in cross-section along line 4—4 of FIG. 2;

FIG. 4A is a rear view in cross-section of another embodiment of a mounting device according to the invention having an alternative side rail construction;

FIG. 5 is a rear view in cross-section of a further embodiment of a mounting device according to the invention having an alternative side rail construction;

FIG. 5A is a rear view in cross-section of yet another embodiment of a mounting device according to the invention having an alternative side rail construction;

FIG. 6 is a rear view of a still further embodiment of a mounting device according to the invention having an alternative side rail construction;

DETAILED DESCRIPTION OF THE INVENTION

Figure 7:
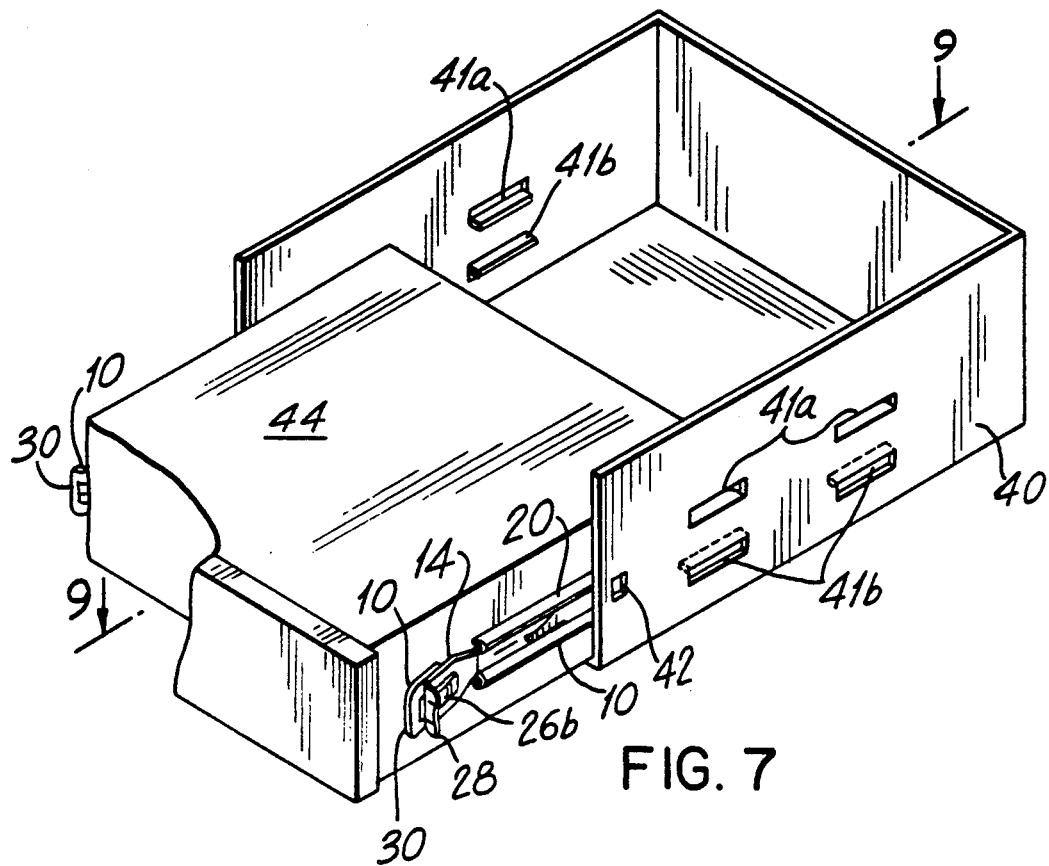
FIG. 7 is a perspective view of a disc drive, having attached to its sides two mounting devices according to FIG. 1, that is partially inserted into a bay.

Referring first to FIGS. 1 to 4, a mounting device 10 according to the invention is shown. The mounting device 10 is constructed entirely of type 301 or 302 stainless steel having a ¼ hardness in the preferred embodiment, which steel has been found to have the proper balance of resiliency, rigidity, and strength, and which is relatively easy to form into the desired shape. It is available from, for example, Bethlehem Steel Corporation, Bethlehem, Pa., or USX Corporation, Pittsburgh, Pa. Other suitable materials can also be used, if desired, including SAE 1050 cold rolled carbon steel, available commercially from the same companies. If the latter material is used, it should preferably be heat treated after forming to a minimum spring temper of 140,000 PSI by ordinary methods known to those in the steel fabrication art.

The device 10 comprises a substantially rectangular body 12 and a connecting member 14 disposed on one end of the body 12. The connecting member 14 is bent from the body 12 to enable resilient movement relative to the remainder of the body 12. The body 12 and most of the connecting member 14 are constructed of a single piece of steel on the order of 0.025 inches thick in the preferred embodiment.

As shown most clearly in FIG. 4, each lengthwise edge of the body 12 is bent to form a U-shaped rail 20 disposed at right angles to the plane of the body 12. The rails 20 cooperate with conventional receiving rails in a disc drive bay for proper installation of the disc drive, as discussed below. Each U-shaped rail 20 comprises an inner wall 20a adjacent to the body 12, a top 20b, and an outer wall 20c. The U-shape of the rails 20 is preferable to other shapes because it is strong and easy to manufacture. It will be appreciated that the rails 20 enable the device 10 to approximate the shape of a thick side piece while allowing the device 10 to be constructed of relatively thin material.

Other possible configurations of the rails 20 are shown in FIGS. 4A, 5, 5A, and 6. In FIG. 4A, the side rails 120 are similar to the rails 20 except that the inner walls 120a are not perpendicular to the body 12. In FIG. 5, side rails 220 are formed by merely bending up the lengthwise edges of the body 12 until they are perpendicular to the rest of the body. In FIG. 5A, the side rails 320 are similar to the rails 20 except that the inner and outer walls 320a and 320c are not spaced from each other. In FIG. 6, side rails 420 are formed by bending up the lengthwise edges of the body 12 as in FIG. 5, and further bending the upper portion of the edges until the upper portion is perpendicular to the lower portion and parallel to the body 12. The rails shown in FIGS. 4A, 5, 5A, and 6 have been found to be less preferable for reasons of strength, exposure of sharp edges, and/or difficulty of manufacture.

As shown in FIGS. 1 to 3, the inner walls 20a and tops 20b of the rails 20 terminate near the end of the body 12 opposite the connecting member 14. The outer walls 20c, however, extend farther. Those extensions of the outer walls 20c are bent around the end of the body 12 so that their ends meet, forming an end wall 22. The end of the body 12 itself is bent slightly upward to form a lip 24 abutting the wall 22, minimizing the exposure of sharp edges. The lip 24 serves as a stiffener to support the wall 22, which serves as a secondary stop as described below.

Two slots 16 are disposed near the center of the body 12 on opposite sides of its midpoint, shown by the dotted line 17 in FIGS. 1 and 2. The slots 16 accommodate fastening means, such as screws, for securing the device 10 to a disc drive in the preferred embodiment. Two grounding tabs 18a and 18b, which are cut from the body 12 and bent away from it, are disposed closer to the ends of the body 12 than the slots 16. The tab 18a is disposed near the connecting member 14, while the tab 18b is disposed near the opposite end of the body 12. A slot 19 is provided in the body 12 below each grounding tab 18a, b. The slots 19 may also be used to accomodate fastening means, if desired.

The ends or tips of the tabs 18a, b are bent toward the body 12, forming an apex 38 on each tab 18a, b. The apices 38 prevent catching or scratching of the chassis during installation and removal of the disc drive from the computer, which could occur if the ends of the tabs were exposed at their highest point. Such a configuration also allows the relatively smooth and flat surface of the apices 38 to contact the sides of the bay for more reliable grounding. In a preferred embodiment, each tab 18a, b is relatively wide at the point where it bends away from the body 12, becoming progressively narrower toward its end. The tabs 18a, b act as springs, having resilient movement, which enables them to continually press against the sides of the bay for proper grounding, while allowing for irregularities or poor fit. The shape of the tabs 18 a, b may be varied depending on the specific spring force desired. Other factors being equal, the wider the base of the tab, the greater the spring force will be. It will be seen, therefore, that the tabs 18a, b may be of the same width at top and bottom if force requirements are low, if, for example, the disc drive to which the device 10 is attached is small and lightweight.

As shown in FIG. 3, the tabs 18a, b are bent at an angle such that their apices 38 are positioned above the tops 20b of the rails 20. This configuration allows the apices 38 to contact the metal side of the bay or receiving rail for grounding. The tabs 18a, b also provide a way of centering a disc drive in the bay. Since the tabs are resilient and extend above the tops of the rails, some side-to-side movement of the disc drive in the bay can be undertaken to center the disc drive in the bay and align the former with a corresponding opening in the overlying fascia of the computer, while still grounding the disc drive to the wall of the bay.

As mentioned above, the connecting member 14 is bent slightly relative to the body 12. A substantially square protrusion 26a is disposed on the surface of the connecting member 14. A second substantially square latching protrusion 26b or male latch member is disposed adjacent to the protrusion 26a, protruding slightly more than the latter. One side of the latching protrusion 26b is separated from the rest of the connecting member 14, forming a latch opening 27.

As mentioned above, the body 12 and most of the connecting member 14 are constructed in the preferred embodiment of a single piece of steel. The end of that piece is turned upward at the connecting member 14 to form a stop or flap 28. A stiffener rib 29 is formed in the center of the stop 28, extending slightly beyond the bend of the stop 28 into the connecting member 14. An extension plate 30 is welded or otherwise secured to the back of the connecting member 14. The extension plate 30 is preferably formed of the same material as the rest of the mounting device 10, but is somewhat thicker, on the order of 0.032 inches thick in the preferred embodiment. A hole 32 in the extension plate 30 (FIG. 2) provides room for the protruding stiffener rib 29.

In an alternative embodiment shown in Fig. 1A, the extension plate 30 is integral with the connecting member 14. The connecting member 14 has two side extensions 14a and 14b which are folded under the connecting member 14 on either side to form the extension plate 30. An interlocking tab 30a is disposed on the extension 14b which fits into a recess in the extension 14a.

FIG. 1A also shows an alternative embodiment of a latching protrusion 26' disposed on the connecting member 14. The latching protrusion 26' rises from the surface of the connecting member 14 to the latch opening 27 at a slope, creating a triangular vertical cross-section.

As shown in FIG. 3, most of the connecting member 14, like the apices 38 of the tabs 18a, b, is disposed above the plane formed by the tops of the rails 20b in the preferred embodiment. This is particularly true of the portion from the protrusion 26b to the end of the extension plate 30.

Figure 8:
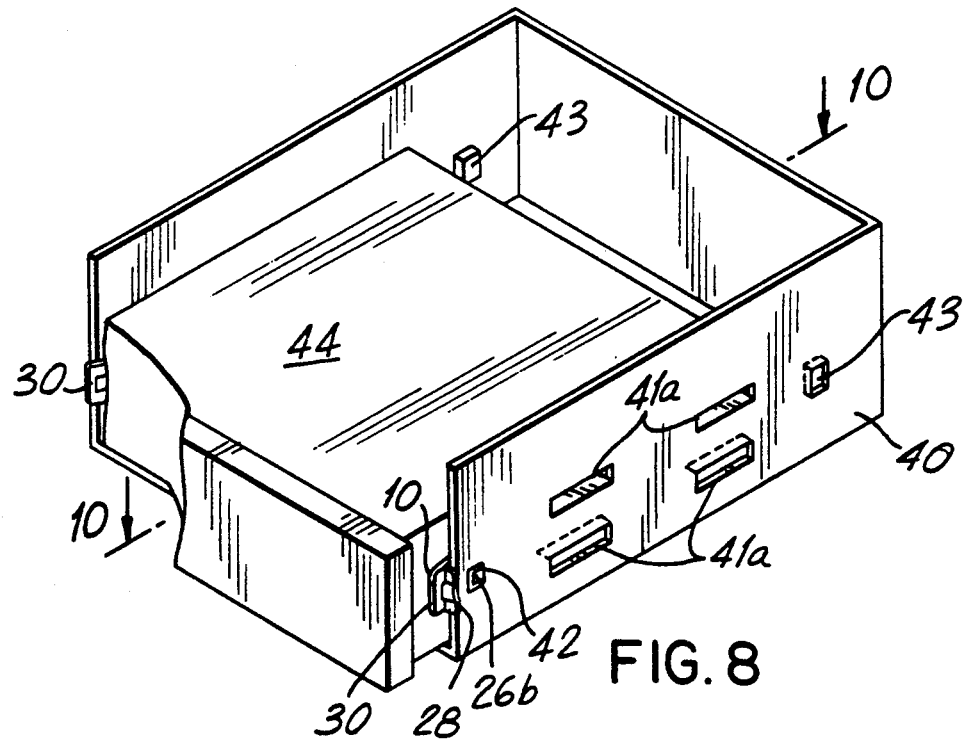
FIG. 8 is a perspective view of a disc drive, having attached to its sides two mounting devices according to FIG. 1, that is fully inserted into a bay.
Figure 9:
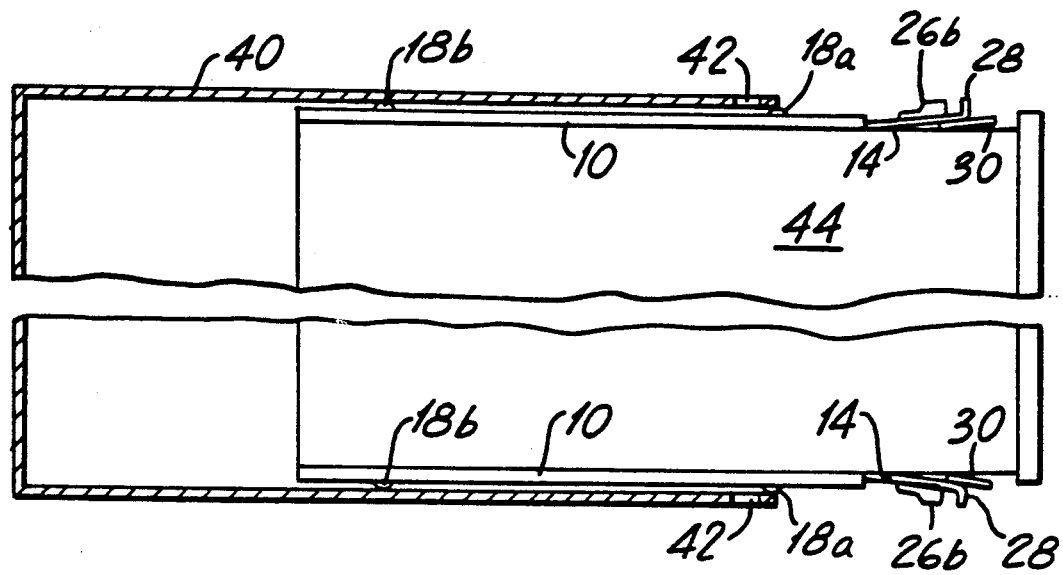
FIG. 9 is a top view in cross-section along line 9—9 in FIG. 7.
Figure 10:
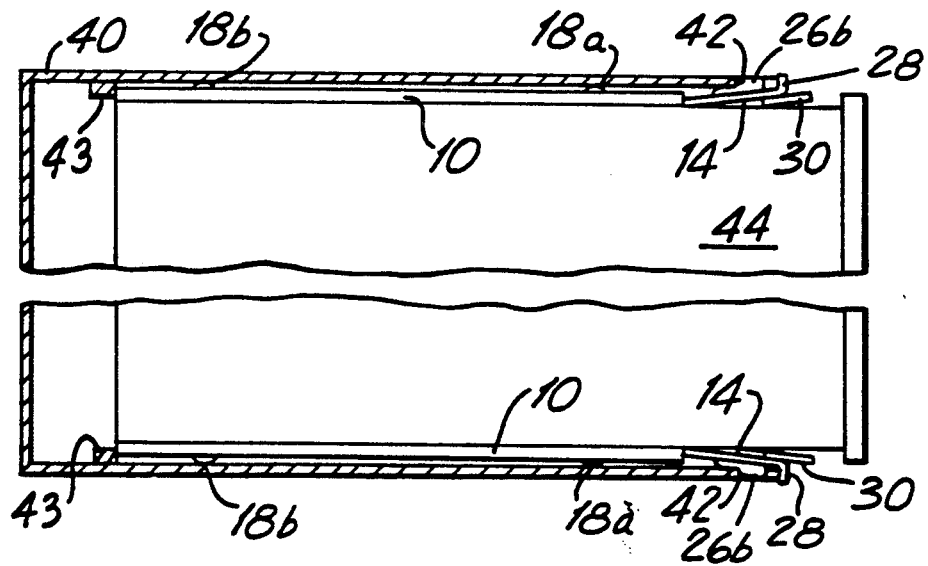
FIG. 10 is a top view in cross-section along line 10—10 in FIG. 8.

As shown in FIGS. 7 to 10, two mounting devices 10 cooperate with a disc drive 44 to securely mount and ground the latter in a bay 40. The mounting devices 10 are attached to the sides of the disc drive 44 by means of screws through the slots 16 and 19, or by any other suitable means such as bolts, rivets, or the like. In order to properly ground the disc drive 44, the bay 40 is constructed of steel or other conducting material in the preferred embodiment, or alternatively, only the portion of the side walls of the bay 40 which contact the mounting device 10 are constructed of conducting material. The bay 40 contains conventional receiving rails 41a and 41b, widely known in the art, which are disposed on the sides of the bay 40, the top receiving rails 41a being spaced from the bottom receiving rails 41b at a distance of slightly greater than the width of the device 10. Latching holes or recesses 42 are disposed on each side wall of the bay 40 and act as female latch members for latching engagement with the protrusions 26b. As shown in FIGS. 8 and 10, optional rear protrusions 43 are disposed near the rear of the side walls of the bay 40. As will be readily understood by those in the art, the bay 40 is preferably designed such that its width is just enough to accommodate the width of the disc drive 44 having attached thereto the mounting devices 10.

In operation, the disc drive 44 is inserted into the bay 40 such that the rails 20 of the devices 10 are placed in sliding engagement with the receiving rails 41a, b. This cooperation of the rails 20 and receiving rails 41a, b facilitates the smooth entry of the disc drive 44 into the bay 40 and prevents vertical movement of the disc drive in the bay. As the disc drive 44 is inserted far enough so that the tabs 18b enter the bay 40, the tabs 18b are deflected by the walls of the bay 40, since in the preferred embodiment the bay 40 is not wide enough to accommodate the tabs 18b without deflecting them. The tabs 18a also enter and are deflected by the walls of the bay 40. The tabs 18a, b will therefore exert continual pressure against the walls of the bay 40, properly grounding the disc drive 44.

It will be appreciated that the downward curve of the tip of the grounding tabs 18b will allow the latter to enter the bay 40 in sliding engagement with the side wall without catching on the front of the bay.

When the disc drive 44 nears full insertion into the bay 40, the side walls of the bay 40 begin to deflect the connecting members 14 back, since the connecting members 14, like the tabs 18a, b, are designed to protrude beyond the tops of the rails 20b in the preferred embodiment. As the disc drive 44 is inserted farther into the bay 40, the latching protrusions 26b reach the latching holes 42, whereupon the protrusions 26b come into latching engagement with the holes 42, with an audible click in a preferred embodiment to notify the operator that the disc drive is fully inserted. This latching engagement prevents the disc drive 44 from moving out of the bay 40. The disc drive is now fully inserted into the bay.

When the disc drive 44 is fully inserted, the stops 28 press against the front of the bay 40, preventing the disc drive 44 from moving farther into the bay 40. Thus, the bay 40 may be longer than the disc drive 44 if, for example, it is desired to accommodate drives of varying lengths. As shown in FIGS. 8 and 10, the protrusions 43 can also be used to delimit the movement of the disc drive 44 by abutting against the end walls 22 (supported by the lips 24) of the device 10. The end walls 22 thus serve as secondary stops in addition to the stops 28. The secondary stop is particularly useful during extreme shipping conditions, especially if the disc drive 44 or other component is particularly heavy.

Vertical movement of the disc drive 44 is prevented by the cooperation of the rails 20 and receiving rails 41, and front-rear horizontal movement is prevented by the latching engagement of the protrusions 26b with the holes 4 and the stops 28 abutting the front of the bay 40, as well as by the protrusions 43. As mentioned above, it may be desired to provide for some side-to-side play between the disc drive 44 and bay 40 so that the former can be centered in the latter. The resilient protruding tabs 18a, b provide for continuous grounding even with some side-to-side displacement.

Figure 11:
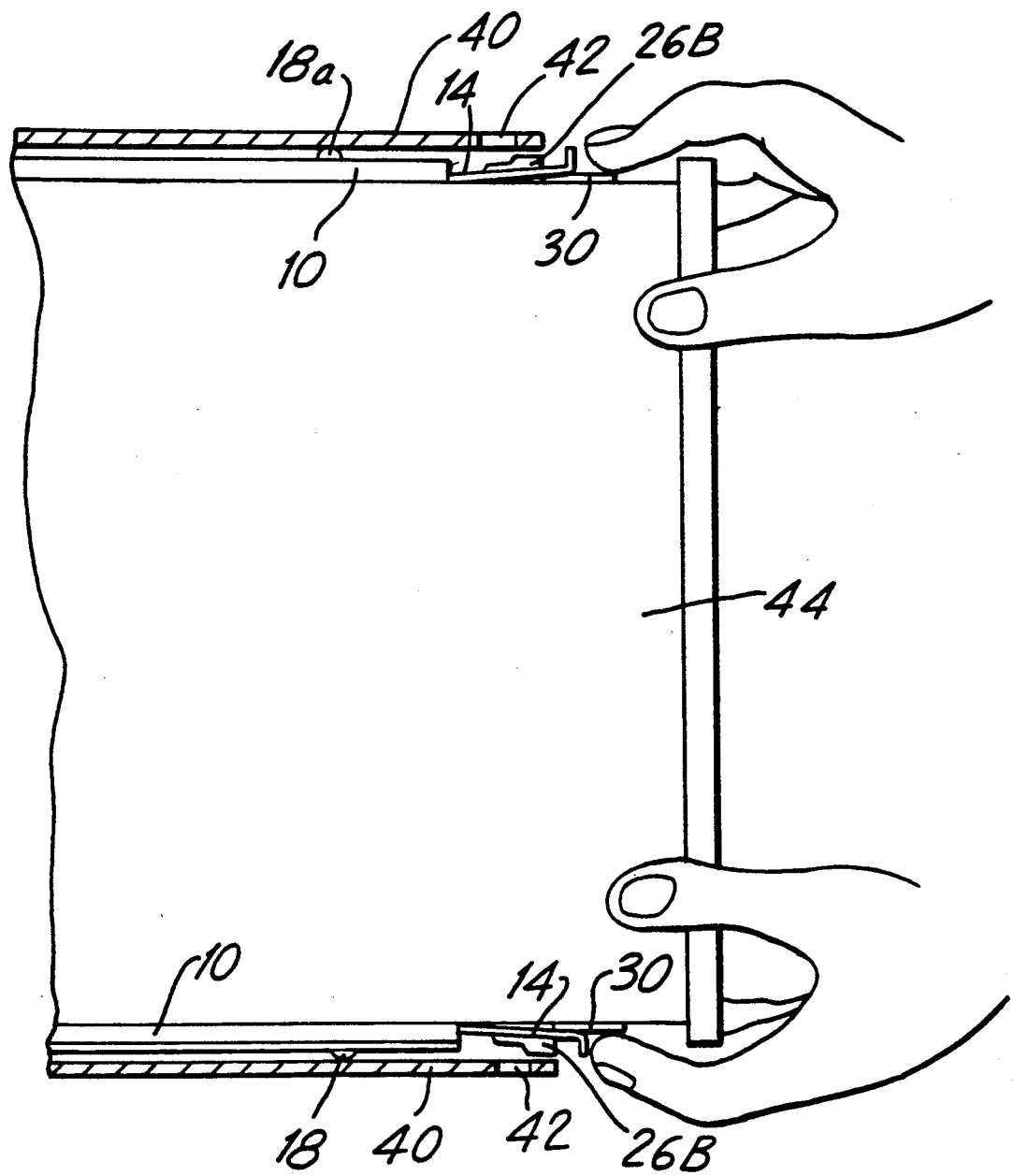
FIG. 11 is a top view in cross-section of a disc drive, having attached on its sides mounting devices according to FIG. 1, that is being removed from a bay.

FIG. 11 illustrates the preferred method of removing the disc drive 44 from the bay 40. Holding the drive with both hands, the operator uses his fingers to deflect the extension plates 30 towards the sides of the drive 44, thereby moving the latching protrusions 26b out of engaged relationship with the latching holes 42. The operator then pulls the disc drive 44 out of the bay 40. It will be appreciated that the sides of the drive serve as a natural stop for the extension plates 30, thereby preventing overstress of the deflected connecting member 14. Since, as with the tabs 18b, the tips of the tabs 18a are curved toward the device 10, the device 10 can be removed from the bay 40 without the tabs 18a catching on the latching holes 42.

This invention is particularly suitable for use in combination with the products described in our copending application entitled, "COMPUTER HOUSING," Ser. No. 07/719,184 filed on even date with this application and commonly assigned to the assignee hereof, the contents of which are incorporated herein by reference as though fully set forth herein.

It will be appreciated by those skilled in the art that the present invention may be used for either hard or floppy disc drives and other removable memory media such as tape cartridges. The invention may also be used with other computer components that are inserted into the computer in a similar fashion, as well as with any component of a machine that is similarly mounted into a receptacle. It will be understood that the preceding disclosure is a detailed description of a preferred embodiment of the invention, and should not be construed to limit the scope of the invention, which is defined by the following claims.

What is claimed is:

1. A device for mounting a computer component in a computer, comprising:
   a body portion adapted for attachment to a component;
   at least one rail having a top disposed lengthwise on said body portion; and
   an electrically-conductive grounding tab having a base and a tip wherein the base of the grounding tab is attached to the body portion and the tip of the grounding tab protrudes from the body portion; and
   wherein the grounding tab is relatively wide at the base, becoming progressively narrower toward its tip.

2. The device of claim 1, wherein said body portion has a first end and a second end, said first end being bent slightly to be resiliently movable relative to the rest of said body portion, and further comprising a male latch member protruding from said first end adapted for engagement with a female latch member disposed on a computer when the component is fully inserted into the computer.

3. The device of claim 1 wherein said body portion has a first end and a second end, and further comprising a stop protruding from said first end for preventing further movement of a component into a computer when the component is fully inserted into the computer.

4. The device of claim 1, wherein said body portion is substantially rectangular, and wherein the top of said rail protrudes from said body portion to a lesser extent than the tip of said grounding tab protrudes from said body portion.

5. The device of claim 1, wherein said at least one rail is created by forming a lengthwise edge of said body portion into a U such that the open end of the U faces a component when said body portion is attached thereto.

6. A device on a computer component for mounting the component into a computer bay, comprising:
   a body portion adapted for attachment to said component, the body portion having a first end and a second end;
   a connecting member disposed at an angle from said body portion on the first end of said body portion;
   a latch protrusion disposed on said connection member and adapted for insertion into a recess provided in a computer bay when said component is fully inserted into the bay;
   a stop extending from said connecting member, such that when said component is fully inserted into the computer bay, said stop abuts the bay, preventing further movement of said component into the bay; and
   a release protrusion attached to said connecting member and extending out of the bay when said component is fully inserted into the bay, said release protrusion extending sufficiently for an operator to deflect said release protrusion, disengage said latch protrusion from said recess, and pull said component out of said computer.

7. The device of claim 6, further comprising two rails, each of which is disposed on a lengthwise edge of said body portion.

8. The device of claim 7, wherein each of said rails is generally in the shape of a U.

9. A device for mounting a computer component into a computer, comprising:
- a substantially rectangular steel piece adapted to be attached to the side of a component, said steel piece having a first end, a body, and a second end, said first end being bent relative to said body;
- two rails, each being disposed on a lengthwise edge of said body, said rails being formed by bending said lengthwise edges into a U-shaped configuration, each rail thus comprising an inner wall, a top, and an outer wall, said inner wall and said top terminating near said second end of said steel piece, said outer wall being bent around said second end to form an end wall, and said second end of said steel piece being bent up slightly to abut said end wall to minimize sharp edges;
- a grounding tab disposed on said steel piece, being angularly disposed from the steel piece to provide the properties of a spring, and whose tip is bent downwardly for smooth insertion of the component into a bay in a computer and for reliable grounding;
- a latch protrusion disposed on said first end for selective latching engagement with a corresponding latch recess in the computer;
- a stop disposed on said first end for selective abutting engagement with the bay of the computer into which the component is inserted; and
- an end wall disposed at said second end of said steel piece.

10. The device of claim 9, wherein said latch protrusion is substantially rectangular, three sides of which are closed and one side of which is open, for secure latching.

11. The device of claim 9, wherein said stop comprises a flap protruding at substantially right angles from said first end.

12. The device of claim 9, further comprising a tab disposed on said first end by which an operator can deflect said first end and remove said latch protrusion from said latch recess, thereby unlatching the component and enabling removal of the component from the computer.

13. An apparatus for mounting a component in a computer bay comprising:
- a body portion adapted for attachment to a component, the body portion having a first end and a second end;
- a connecting member mounted on the first end of the body portion adapted to move with respect to the body portion;
- a latch protrusion disposed on the connecting member adapted for engagement with a recess provided in a computer bay when the component is fully inserted into the bay;
- a stop extending from the connecting member at an angle such that when the component is fully inserted into the bay, the stop contacts the bay, preventing further movement of the component; and
- a release tab mounted to the connecting member such that when the component is fully inserted into the bay, the release tab extends out of the bay sufficiently for an operator to deflect the release protrusion thereby disengaging the latch protrusion from the recess.

14. The apparatus of claim 13 further comprising at least one rail disposed on a lengthwise edge of the body portion.

15. The apparatus of claim 14 wherein the rail has a substantially U-shaped cross section.

16. The apparatus of claim 13 wherein the latch protrusion is substantially rectangular, three sides of which are connected to the connecting member.

17. The apparatus of claim 13, wherein the stop comprises a flap protruding at a substantially right angle from the connecting member.

* * * * *